United States Patent
Rajgopal et al.

[11] Patent Number: 5,882,981
[45] Date of Patent: Mar. 16, 1999

[54] MESA ISOLATION REFILL PROCESS FOR SILICON ON INSULATOR TECHNOLOGY USING FLOWAGE OXIDES AS THE REFILL MATERIAL

[75] Inventors: Rajan Rajgopal, Singapore, India; Kelly J. Taylor, Allen, Tex.; Thomas R. Seha, Dallas; Keith A. Joyner, Richardson, both of Tex.

[73] Assignee: Texas Instruments Incorporated, Dallas, Tex.

[21] Appl. No.: 902,010

[22] Filed: Jul. 29, 1997

[51] Int. Cl.$^6$ .................. H01L 21/225; H01L 21/316; H01L 21/265
[52] U.S. Cl. .................. 438/404; 438/412; 438/151; 438/163; 148/DIG. 44; 257/347
[58] Field of Search .................. 438/404, 412, 438/164, 624, 151, 163; 148/DIG. 44; 257/347

[56] References Cited

U.S. PATENT DOCUMENTS

| | | | |
|---|---|---|---|
| 5,028,564 | 7/1991 | Chang et al. | 438/412 |
| 5,429,990 | 7/1995 | Liu et al. | 438/624 |
| 5,482,871 | 1/1996 | Pollack | 438/164 |

*Primary Examiner*—Charles Bowers, Jr.
*Assistant Examiner*—David S. Blum

*Attorney, Agent, or Firm*—Jacqueline J. Gardner; W. James Brady III; Richard L. Donaldson

[57] ABSTRACT

After formation of a sandwich over a substrate of a layer of silicon dioxide (3) followed by a layer of silicon (1) having a pad oxide (7) thereon and a patterned silicon nitride layer (9) over the pad oxide, the unmasked portion of the pad oxide and silicon are removed to provide mesas of silicon with silicon nitride thereover and possibly removal of some of the buried oxide layer. A flowable insulator (15), preferably silsesquioxane ($H_xSiO_{1.5}$, where $x \leq 1$, depending upon the level of polymerization) in a contaminant-free, high purity solvent which is later removed during an annealing step, is placed over the exposed surface such that it fills the voids between the mesas of silicon with silicon nitride thereon and extends over the nitride. The flowable insulator, due to its flowability, provides a generally planar surface. The flowable insulator is etched back and a cap oxide (17) is optionally deposited over the etched back insulator layer. The cap oxide layer (if used), some insulator and nitride are then etched away, leaving the pad oxide over the silicon. The processing is then completed by removing the pad oxide, growing a gate oxide and then forming the gate and source drain electrodes and/or other processing techniques that may be required to provide the final device.

8 Claims, 1 Drawing Sheet

5,882,981

MESA ISOLATION REFILL PROCESS FOR SILICON ON INSULATOR TECHNOLOGY USING FLOWAGE OXIDES AS THE REFILL MATERIAL

BACKGROUND OF THE INVENTION

1. Field of the Invention

This invention relates to mesa isolation and, more specifically, to a method of mesa isolation and the isolated mesa structure.

2. Brief Description of the Prior Art

The procedure generally used for mesa isolation in silicon-on-insulator (SOI) technology is to provide an oxide (insulator) layer which becomes a buried layer after a layer of silicon is formed thereon and then etching the silicon to form silicon mesas on the buried layer with portions of the buried layer being exposed. A major problem with the above-described mesa isolation scheme utilized in current silicon on insulator (SOI) processes is that the exposed buried oxide insulator is reduced in thickness during processing. This reduction in the buried oxide insulator thickness leads to possible exposure of type II buried oxide defects, such defects causing short circuits between the substrate beneath the buried oxide and an electrical conductor such as polycrystalline silicon (polysilicon) on the reduced thickness buried oxide. The thinning of the buried oxide also leads to high interconnect capacitance, thereby reducing one of the major advantages of SOI technology. It is therefore apparent that a process which will minimize such buried oxide thinning and/or compensate for such buried oxide thinning is highly desirable.

SUMMARY OF THE INVENTION

In accordance with the present invention, there is provided a process and SOI device which overcomes the problem of reduced thickness buried oxide as discussed above.

An SOI substrate is provided having a pad oxide thereon and a patterned silicon nitride layer over the pad oxide masking a portion of the pad oxide. The unmasked portion of the pad oxide and silicon are removed to provide mesas of silicon with silicon nitride thereover and possibly removal of some of the buried oxide layer. The above described problem resulting from the thinned buried oxide layer is alleviated in accordance with the present invention by placing a flowable electrically insulating material including the solvent, if required, preferably a carbon-free flowable oxide such as a spin on glass and still more preferably a flowable silsesquioxane ($H_xSiO_{1.5}$, where $x \leq 1$, depending upon the level of polymerization) in a contaminant-free solvent, which is later removed during an annealing step and causes hardening of the flowable electrically insulating material over the exposed surface such that it fills the voids between the mesas of silicon with silicon nitride thereon and extends over the nitride. The flowable insulator, due to its flowability, provides a generally planar surface. The flowable insulator is etched back and a cap oxide is optionally deposited over the insulator layer. The cap oxide layer, if any, part of the flowable oxide and all of the nitride layer are removed. The processing is then completed by removing the pad oxide, growing a gate oxide and then forming the gate and source drain electrodes and/or other processing techniques that may be required to provide the final device.

It can be seen that a flowable insulator has been used early in the fabrication process as an isolation refill and before gate oxide formation to provide accurate filling of even deep trenches. The silsesquioxane embodiment provides the added advantage by being used early in the fabrication process that it can withstand processing temperatures in the 800° to 900° C. range, which temperatures are present during the front end of the process flow, without being degraded other than the removal of the solvent, which is a desirable result. The use of a flowable oxide as an isolation refill results in substantial planarization of the substrate over small to medium distances (up to ~50 μm). This reduces the requirement for other planarization, such as chemical mechanical polsihing (CMP).

DESCRIPTION OF THE PREFERRED EMBODIMENT

Figure 2:
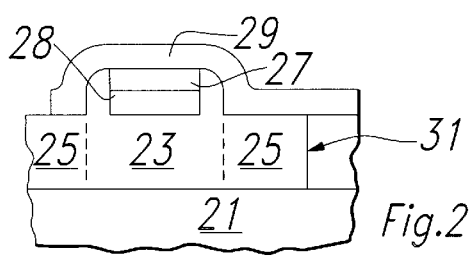
FIG. 2 is a schematic diagram showing the prior art and a problem therein which is overcome in accordance with the present invention.

Referring first to FIG. 2, there is shown a typical prior art SOI device having a substrate 21 with a buried electrically insulating oxide layer 23 thereover having a region of reduced thickness 25. A gate oxide 27 is disposed over a silicon layer 28 that is disposed over the buried oxide 23 and a polysilicon electrically conductive layer is disposed over the gate oxide 27 and extends over the region of reduced thickness 25. As can be seen, due to the type II defect 31 in the region 25, there is a direct current path from the polysilicon layer 29 to the substrate 21 which can result in a short circuit. Since this type of defect typically does not extend entirely through the buried oxide it is apparent that such defects increase the possibility of a short circuit with decrease in thickness of the buried layer 23.

Figure 1A:
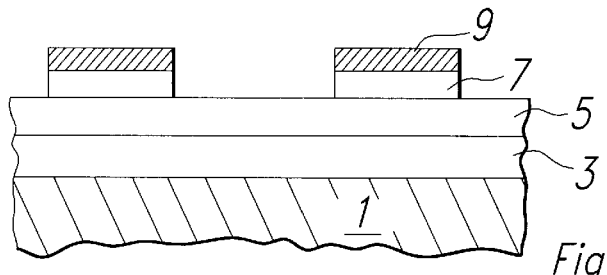
FIGS. 1a to 1e represent a portion of the process flow for fabrication of the semiconductor device in accordance with the present invention.
Figure 1B:
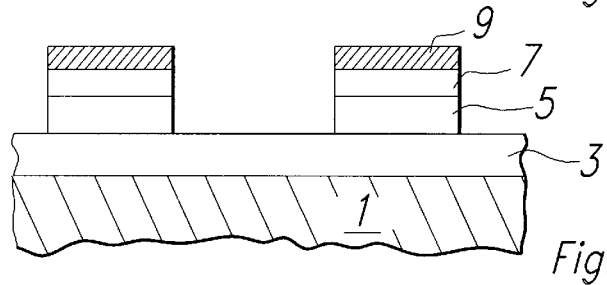
Figure 1C:
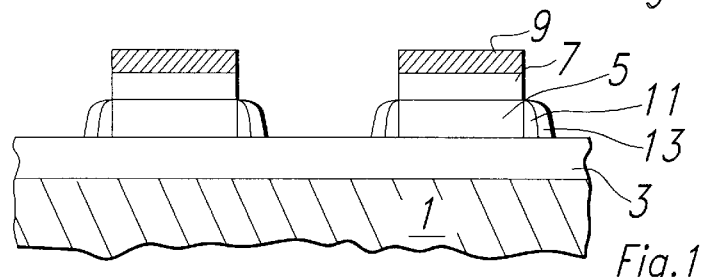

Referring now to FIG. 1a, there is shown a typical prior art partially fabricated SOI structure as would be used in fabrication of the device of FIG. 2 wherein there is provided on a silicon substrate 1 a buried insulator oxide layer 3 over which is a layer of silicon 5. A pad oxide 7, which previously covered the layer of silicon 5 with a chemical vapor deposited (CVD) silicon nitride mask 9 thereon has been provided and the unmasked portion of the pad oxide has been removed by etching to provide the arrangement shown if FIG. 1a. A silicon etchant is then introduced to etch away the exposed portion of the silicon layer 5 as shown in FIG. 1b. This etching step, if not terminated precisely upon removal of all of the silicon 5 in the unmasked region, will also remove a portion of the exposed buried insulator oxide 3 and thereby possibly cause the problems as enumerated above with the resulting buried oxide having reduced thickness. A sidewall oxide/nitride is then optionally formed on the sidewalls of the exposed silicon layer 5 by thermally growing a layer of silicon oxide 11 (e.g. 200 Å) and then optionally depositing a layer of silicon nitride 13 (e.g. 150 Å) which is a diffusion barrier for oxidizing species as shown in FIG. 1c. The nitride sidewall is optional and can be formed by performing an isotropic deposition followed by an anisotropic etch.

Figure 1D:
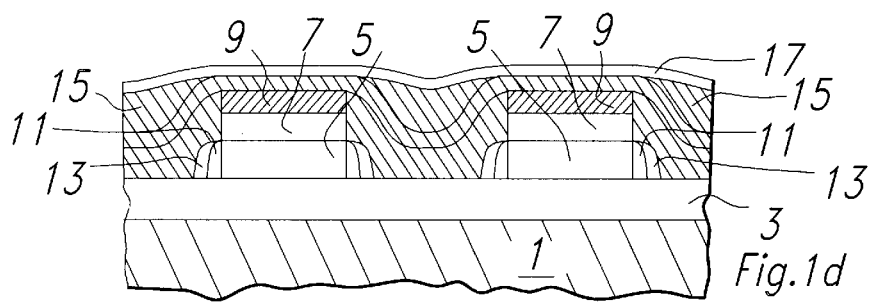
Figure 1E:
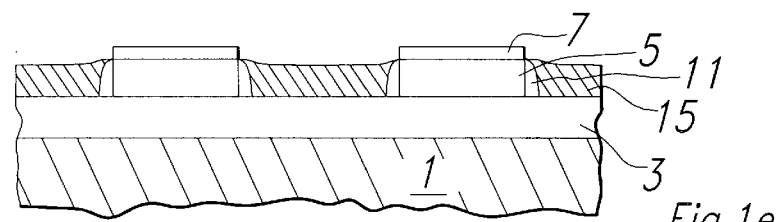

The above described problem is alleviated in accordance with the present invention by placing a flowable insulator 15, preferably a flowable silsesquioxane ($H_xSiO_{1.5}$, where $x \leq 1$, depending upon the level of polymerization) in a contaminant-free solvent which is removed during annealing, preferably methylisobutylketone (MIBK), though hexamethyldisiloxane (HMDSO)/ octamethyltrisiloxane (OMTSO), for example, can be used, over the exposed surface of FIG. 1c such that it fills the voids between the mesas of silicon 5 with silicon nitride 7 thereon and extending over the nitride. The flowable insulator 15, due to its flowability, will provide a generally planar surface. The flowable insulator 15 is etched back and an optional cap oxide layer 17 (e.g., 500 Å) of silicon oxide is deposited over the etched back insulator layer 15 as shown in FIG. 1d. The cap oxide layer 17 (if used), some of the insulator 15 and all of the nitride 9 are then etched away, leaving the pad oxide 7 over the silicon 5 as shown in FIG. 1e. The processing is then completed by removing the pad oxide 7, growing a gate oxide (not shown) and then forming the gate and source drain electrodes and/or other processing techniques that may be required to provide the final device.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of isolating mesas in the fabrication of semiconductor devices which comprises the steps of:

(a) providing a plurality of single crystal silicon mesas with a top surface disposed on an electrically insulating layer with said insulating layer disposed over a substrate;

(b) depositing a flowable electrically insulating material with a top surface between and over said mesas to a level that is above that of the top surface of said mesas;

(c) etching back the device of step (b) to expose the top surface of said silicon mesas while maintaining a substantially planar surface with the top surface of said mesas and the top surface of the electrically insulating material; and (d) completing fabrication of said device.

2. The method of claim 1 wherein said step of completing fabrication comprises formation of a gate oxide over the top surface of the exposed silicon mesas, forming a gate electrode over said gate oxide and forming source/drain electrodes in said top surface of the exposed silicon mesas adjacent said gate oxide.

3. The method of claim 1 further including the step of altering said flowable electrically insulating material to a nonflowable state prior to step (c).

4. The method of claim 2 further including the step of altering said flowable electrically insulating material to a non-flowable state prior to step (c).

5. The method of claim 1 wherein said flowable electrically insulating material is a silsesquioxane having the formula $H_xSiO_{1.5}$, where $x \leq 1$.

6. The method of claim 2 wherein said flowable electrically insulating material is a silsesquioxane having the formula $H_xSiO_{1.5}$, where $x \leq 1$.

7. The method of claim 3 wherein said flowable electrically insulating material is a silsesquioxane having the formula $H_xSiO_{1.5}$, where $x < 1$.

8. The method of claim 4 wherein said flowable electrically insulating material is a silsesquioxane having the formula $H_xSiO_{1.5}$, where $x \leq 1$.

* * * * *

UNITED STATES PATENT AND TRADEMARK OFFICE
CERTIFICATE OF CORRECTION

PATENT NO.    : 5,882,981
DATED         : Mar. 16, 1999
INVENTOR(S)   : Rajan Rajgopal, et al It is certified that error appears in the above-identified patent and that said Letters Patent is hereby corrected as shown below:

Title page, insert the following item:

--Related U.S. Application Data
[60] Provisional application No. 60/023,128, Jul. 30, 1996.--

Column 1, line 5, insert the following:

--This application claims Priority under 35 USC § 119(e) (1) of Provisional application No. 60/023,128 filed Jul. 30, 1996.--

Signed and Sealed this

Twenty-first Day of September, 1999

Attest:

Q. TODD DICKINSON

*Attesting Officer*   *Acting Commissioner of Patents and Trademarks*